US009249309B2

(12) United States Patent
Isogai et al.

(10) Patent No.: US 9,249,309 B2
(45) Date of Patent: Feb. 2, 2016

(54) BASE COAT COATING COMPOSITION, COMPOSITE FILM, AND METHOD FOR PRODUCING SAME

(75) Inventors: Takashi Isogai, Saitama (JP); Hirohito Kudou, Anjo (JP); Keiji Koike, Anjo (JP)

(73) Assignees: Fujikura Kasei Co., Ltd., Tokyo (JP); Central Motor Wheel Co., Ltd., Aichi (JP)

( * ) Notice: Subject to any disclaimer, the term of this patent is extended or adjusted under 35 U.S.C. 154(b) by 195 days.

(21) Appl. No.: 13/574,746

(22) PCT Filed: Jan. 25, 2011

(86) PCT No.: PCT/JP2011/051327
§ 371 (c)(1),
(2), (4) Date: Jul. 23, 2012

(87) PCT Pub. No.: WO2011/093275
PCT Pub. Date: Aug. 4, 2011

(65) Prior Publication Data
US 2012/0288707 A1   Nov. 15, 2012

(30) Foreign Application Priority Data
Jan. 27, 2010  (JP) .................................. 2010-015886

(51) Int. Cl.
*C09D 4/00* (2006.01)
*C09D 163/00* (2006.01)
*C09D 163/10* (2006.01)
*C23C 14/02* (2006.01)
*C23C 14/16* (2006.01)
*C08F 220/32* (2006.01)
*C09D 133/06* (2006.01)
*B05D 5/06* (2006.01)
*B05D 7/00* (2006.01)

(52) U.S. Cl.
CPC ................ *C09D 4/00* (2013.01); *C08F 220/32* (2013.01); *C09D 133/06* (2013.01); *C09D 163/00* (2013.01); *C09D 163/10* (2013.01); *C23C 14/024* (2013.01); *C23C 14/165* (2013.01); *B05D 5/068* (2013.01); *B05D 7/50* (2013.01); *Y10T 428/265* (2015.01)

(58) Field of Classification Search
CPC ........ B05D 5/068; B05D 7/50; C08F 220/32; C09D 133/06; C09D 163/00; C09D 163/10; C09D 4/00; C23C 14/024; C23C 14/165; Y10T 428/265
USPC ............. 428/336, 411.1, 545, 413, 416, 410, 428/420; 106/1.05, 287.22; 204/192.1; 977/755
See application file for complete search history.

(56) References Cited

U.S. PATENT DOCUMENTS

| 4,789,620 A * | 12/1988 | Sasaki et al. ................ 430/280.1 |
| 5,891,515 A * | 4/1999 | Dutheil et al. ................ 427/185 |
| 6,268,060 B1 * | 7/2001 | Mokerji ........................ 428/446 |
| 8,969,428 B2 * | 3/2015 | Hiller et al. ............... C09D 4/00 522/100 |
| 2005/0217789 A1 * | 10/2005 | Eckstein et al. .......... 156/244.11 |
| 2009/0238981 A1 * | 9/2009 | Decker et al. ................. 427/386 |

FOREIGN PATENT DOCUMENTS

| CN | 1324054 C | 7/2007 |
| CN | 101307194 A | 11/2008 |
| JP | 01149880 A | 6/1989 |
| JP | 04088065 A | 3/1992 |
| JP | 6073937 A | 9/1994 |
| JP | 2002173635 A | 6/2002 |
| JP | 2002219771 A | 8/2002 |
| JP | 2003049095 A | 2/2003 |
| JP | 2003221408 A | 8/2003 |
| JP | 2005015819 A | 1/2005 |
| JP | 2005171088 A | 6/2005 |
| JP | 2006026948 A | 2/2006 |
| JP | 2010090186 A | 4/2010 |
| JP | 2011021152 A | 2/2011 |
| JP | 2011021153 A | 2/2011 |
| TW | I229701 | 3/2005 |
| WO | 2007138396 A1 | 12/2007 |
| WO | WO 2009/100899 | * 8/2009 |

OTHER PUBLICATIONS

Republic of China Patent Office, Office Action issued in corresponding Chinese Patent Application No. 201180007146.3 and English language translation (Apr. 25, 2014) (8 pages).

(Continued)

*Primary Examiner* — Callie Shosho
*Assistant Examiner* — Michael B Nelson
(74) *Attorney, Agent, or Firm* — Wood, Herron & Evans, LLP

(57) ABSTRACT

A base coat coating composition which is able to suppress cracking of a metal thin film, even when a tough top coat layer capable of satisfactorily protecting the metal thin film is formed on the metal thin film, and even when a heat resistance test is performed, as well as a composite film and a method for producing the composite film. Specifically, a base coat coating composition used for undercoating a metal thin film formed on a metal substrate, and containing a coating film-forming component which contains at least 30% by mass of an epoxy (meth)acrylate having a cyclic structure and has an average molecular weight between crosslinks of 180 to 1,000, as well as a composite film having a base coat layer obtained from the base coat coating composition, and a method for producing the composite film.

11 Claims, No Drawings

(56) References Cited

OTHER PUBLICATIONS

Office Action issued in Taiwanese Patent Application No. 100102554; May 21, 2013; 12 pages.

International Search Report issued in International Patent Application No. PCT/JP2011/051327, mailed Apr. 19, 2011, 7 pages.

European Search Report issued in European Patent Application No. 11736988.4, mailed Jun. 3, 2015, 6 pages.

* cited by examiner

US 9,249,309 B2

BASE COAT COATING COMPOSITION, COMPOSITE FILM, AND METHOD FOR PRODUCING SAME

TECHNICAL FIELD

The present invention relates to a base coat coating composition, a composite film and a method for producing the composite film.

Priority is claimed on Japanese Patent Application No. 2010-15886, filed Jan. 27, 2010, the content of which is incorporated herein by reference.

BACKGROUND ART

The surfaces of vehicle components and the like composed of a metal substrate (such as the aluminum wheels of automobiles) are often coated with a metal thin film in order to impart the component with superior design properties and a more luxurious feel. Examples of methods for forming these types of metal thin films include conventional methods such as vapor deposition methods and sputtering methods. Further, chrome or chrome alloys are frequently used as the metal for forming these metal thin films. Metal thin films formed from chrome or chrome alloys have a high degree of hardness and a darkish texture, yielding an external appearance with a very luxurious look.

When forming a metal thin film on the surface of a substrate, a base coat layer is usually provided on the substrate surface, with the metal thin film then being formed on top of the base coat layer. A top coat layer is typically provided on the surface of the metal thin film for the purpose of protecting the metal thin film. Moreover, in order to improve the adhesion between the substrate and the base coat layer, the surface of the substrate is sometimes subjected to a powder coating treatment prior to formation of the base coat layer (for example, see Patent Document 1).

DOCUMENTS OF RELATED ART PATENT DOCUMENTS

[Patent Document 1] Japanese Examined Patent Application, Second Publication No. 06-73937

Disclosure of Invention Problems to be Solved by the Invention

However, although metal thin films formed from chrome and chrome alloys exhibit excellent hardness, they tend to be brittle and prone to cracking. These problems are particularly marked in those cases where, as disclosed in Patent Document 1, a top coat layer is provided on top of the metal thin film. This is because when heat-curing or heat-drying is performed during formation of the top coat layer, the base coat layer provided between the substrate and the metal thin film often expands with the heat, but the metal thin film formed from chrome or a chrome alloy is hard, and is therefore unable to conform to the changes in the base coat layer, resulting in cracking of the metal thin film.

Further, if the substrate surface is subjected to a powder coating treatment prior to formation of the base coat layer, then because the powder coating formed on the substrate also expands under heat in a similar manner to the base coat layer, the degree of change is magnified, and the metal thin film becomes even more prone to cracking.

Accordingly, in order to prevent cracking of the metal thin film, it has been necessary to avoid the use of various coating materials capable of forming tough films as the coating material for the top coat layer, including heat-curable coating materials that require application of a high temperature for curing, and ultraviolet-curable coating materials which require only a short time for film formation, but produce a momentary rapid increase in the temperature of the substrate surface as a result of the ultraviolet irradiation performed during curing. As a result, because materials are used which, although being able to suppress the cracking of the metal thin film during formation of the top coat layer, are unable to form a tough top coat layer, the level of protection for the metal thin film has often proven unsatisfactory. Further, if a heat resistance test or the like is performed, the metal thin film still tends to be prone to cracking.

The present invention takes the above circumstances into consideration, with an object of providing a base coat coating composition which is able to suppress cracking of a metal thin film, even when a tough top coat layer capable of satisfactorily protecting the metal thin film is formed on the metal thin film, or even when a heat resistance test is performed, as well as providing a composite film and a method for producing the composite film.

Means to Solve the Problems

A base coat coating composition of the present invention is used for undercoating a metal thin film formed on a metal substrate, and contains a coating film-forming component which contains at least 30% by mass of an epoxy (meth) acrylate having a cyclic structure and has an average molecular weight between crosslinks of 180 to 1,000.

Further, the epoxy (meth)acrylate having a cyclic structure is preferably a phenol novolac epoxy (meth)acrylate and/or a cresol novolac epoxy (meth)acrylate.

Furthermore, a composite film of the present invention contains a base coat layer formed by applying the aforementioned base coat coating composition to a metal substrate, a metal thin film formed on the base coat layer and having a thickness of 10 to 70 nm, and a top coat layer formed on the metal thin film.

Moreover, the metal for the metal thin film is preferably chrome or a chrome alloy.

Further, a powder coating is preferably formed between the metal substrate and the base coat layer.

Moreover, a chemical conversion coating is preferably formed on the surface of the metal substrate on which the base coat layer is to be formed.

A method for producing a composite film according to the present invention includes a step of applying the aforementioned base coat coating composition to a metal substrate to form a base coat layer, a step of forming a metal thin film having a thickness of 10 to 70 nm on the base coat layer by sputtering, and a step of forming a top coat layer on the metal thin film, wherein conditions for the sputtering include an inert gas pressure of 0.05 to 1.00 Pa, a deposition rate of 1 to 10 nm/second, and a target power of 1.0 to 10.0 W/cm$^2$.

Moreover, the sputtering is preferably performed using chrome or a chrome alloy.

Furthermore, the base coat layer is preferably formed on the surface of the metal substrate after subjecting the surface of the metal substrate to a chemical conversion treatment and/or a powder coating treatment.

Effects of the Invention

The present invention is able to provide a base coat coating composition which is able to suppress cracking of a metal thin film, even when a tough top coat layer capable of satisfactorily protecting the metal thin film is formed on the metal thin film, or even when a heat resistance test is performed, and is also able to provide a composite film and a method for producing the composite film.

EMBODIMENTS OF THE INVENTION

The present invention is described below in further detail.
[Base Coat Coating Composition]
The base coat coating composition of the present invention (hereinafter also referred to as simply the "coating composition") is an active energy beam-curable coating composition for a metal thin film, and is used for forming a base coat layer as an undercoat, prior to formation of the metal thin film on a metal substrate.

This coating composition contains a coating film-forming component which contains at least 30% by mass of an epoxy (meth)acrylate having a cyclic structure.

In the present invention, the term "(meth)acrylate" refers to either one or both of the methacrylate and the acrylate.
<Coating Film-Forming Component>
(Epoxy (meth)acrylate having a cyclic structure)
Epoxy (meth)acrylates having a cyclic structure are rigid compounds. Accordingly, by including the epoxy (meth)acrylate having a cyclic structure, the coating film-forming component is able to adhere strongly to the metal substrate, and can form a base coat layer that tends to be resistant to expansion, even when heated. As a result, even when a top coat layer is provided on the metal thin film formed on the base coat layer, or even when heating is performed during a heat resistance test, because the base coat layer is resistant to expansion, there is no necessity for the metal thin film to conform to changes in the base coat layer, meaning cracking of the metal thin film can be suppressed.

There are no particular limitations on the cyclic structure, and examples include alicyclic structures and aromatic cyclic structures.

Examples of epoxy (meth)acrylates having an alicyclic structure include hydrogenated phenol-based epoxy (meth)acrylates, cyclohexyl-based epoxy (meth)acrylates, norbornane-based epoxy (meth)acrylates, and dicyclopentanyl-based epoxy (meth)acrylates.

Further, commercially available products can be used as the epoxy (meth)acrylate having an alicyclic structure, and an example is the product DA-722 manufactured by Nagase ChemteX Corporation.

On the other hand, examples of epoxy (meth)acrylates having an aromatic cyclic structure include phenol novolac epoxy (meth)acrylates, cresol novolac epoxy (meth)acrylates, phenol-based epoxy (meth)acrylates, and bisphenol A epoxy (meth)acrylates.

Further, commercially available products can be used as the epoxy (meth)acrylate having an aromatic cyclic structure, and examples include the products DA-141, DA-721 and DA-250 manufactured by Nagase ChemteX Corporation, and the products Ebecryl 600 and Ebecryl 3700 manufactured by Daicel-Cytec Co., Ltd.

Among these epoxy (meth)acrylates having a cyclic structure, from the viewpoint of more effectively suppressing cracking of the metal thin film, a phenol novolac epoxy (meth)acrylate or a cresol novolac epoxy (meth)acrylate is preferred.

As the epoxy (meth)acrylate having a cyclic structure, a single compound may be used alone, or two or more compounds may be used in combination.

The amount of the epoxy (meth)acrylate having a cyclic structure, based on an amount of 100% by mass for the entire coating film-forming component, must be at least 30% by mass, and is preferably within a range from 30 to 90% by mass, and more preferably from 30 to 75% by mass. Provided the amount of the epoxy (meth)acrylate having a cyclic structure is at least 30% by mass, the effect of the epoxy (meth)acrylate having a cyclic structure can be satisfactorily realized. Namely, cracking of the metal thin film can be suppressed even when a top coat layer is provided on the metal thin film formed on the base coat layer, or even when heating is performed during a heat resistance test.

The amount of the epoxy (meth)acrylate having a cyclic structure, based on an amount of 100% by mass for the entire coating film-forming component, may even be 100% by mass. However, if the amount is 100% by mass, then in order to ensure more effective suppression of cracking of the metal thin film, the epoxy (meth)acrylate having a cyclic structure is preferably a phenol novolac epoxy (meth)acrylate and/or a cresol novolac epoxy (meth)acrylate.
(Active Energy Beam-Curable Compound)
The coating film-forming component may also contain an active energy beam-curable compound (excluding epoxy (meth)acrylates having a cyclic structure).

Examples of the active energy beam-curable compound include urethane (meth)acrylates, and (meth)acrylate compounds having at least one (meth)acryloyl group within the molecule.

The urethane (meth)acrylate can be obtained by reacting a polyisocyanate compound, a polyol, and a (meth)acrylate having a hydroxyl group.

Examples of the polyisocyanate compound include hexamethylene diisocyanate, tolylene diisocyanate, isophorone diisocyanate, xylylene diisocyanate, norbornene diisocyanate, 1,3-bis(isocyanatomethyl)cyclohexane, the trimer of isophorone diisocyanate, hydrogenated xylylene diisocyanate, and hydrogenated diphenylmethane diisocyanate.

Examples of the polyol include polyether polyols such as polyethylene glycol, polypropylene glycol and polytetramethylene glycol, polyhydric alcohols such as ethylene glycol, propylene glycol, 1,6-hexanediol, neopentyl glycol, trimethylolpropane and pentaerythritol, polyester polyols obtained by reacting a polyhydric alcohol with a polybasic acid such as adipic acid, as well as polycarbonate polyols, 1,4-cyclohexanediol and 2,2'-bis(4-hydroxycyclohexyl)propane. Among these, 1,6-hexanediol is preferred. These compounds may be used individually, or two or more compounds may be used in combination.

Examples of the (meth)acrylate having a hydroxyl group include 2-hydroxyethyl (meth)acrylate, 2-hydroxypropyl (meth)acrylate, glycerol di(meth)acrylate, polyethylene glycol (meth)acrylate, pentaerythritol tri(meth)acrylate, dipentaerythritol penta(meth)acrylate, caprolactone-modified 2-hydroxyethyl(meth)acrylate, and caprolactone-modified pentaerythritol tri(meth)acrylate. Among these, 2-hydroxyethyl (meth)acrylate is preferred. These compounds may be used individually, or two or more compounds may be used in combination.

By reacting an aforementioned polyisocyanate compound with a polyol, and then reacting the thus obtained product with a (meth)acrylate having a hydroxyl group, a urethane (meth)acrylate is obtained. The equivalence ratio between the polyisocyanate compound, the polyol and the (meth)acrylate having a hydroxyl group may be determined stoichiometrically, but for example, an approximate ratio of polyol:polyisocyanate compound:(meth)acrylate having a hydroxyl group=1:1.1 to 2.0:0.1 to 1.2 is preferred. A conventional catalyst may be used in the reaction.

Further, a commercially available material may also be used as the urethane (meth)acrylate, and examples include the urethane oligomer Ebecryl 1290 manufactured by Daicel-Cytec Co., Ltd., and the urethane oligomer UV-3200B manufactured by The Nippon Synthetic Chemical Industry Co., Ltd.

Examples of (meth)acrylate compounds having one (meth) acryloyl group within the molecule include methyl(meth) acrylate, ethyl(meth)acrylate, n-butyl(meth)acrylate, t-butyl (meth)acrylate, benzyl(meth)acrylate, ethoxyethyl(meth) acrylate, butoxyethyl (meth)acrylate, hydroxyethyl(meth) acrylate, cyclohexyl(meth)acrylate, t-butylcyclohexyl (meth) acrylate, dicyclohexylpentanyl(meth)acrylate, tricyclodecanedimethanol (meth)acrylate and isobornyl (meth)acrylate.

Among these, compounds having an alicyclic structure are preferred, and specific examples of such compounds include cyclohexyl(meth)acrylate, t-butylcyclohexyl (meth)acrylate, dicyclohexylpentanyl(meth)acrylate, tricyclodecanedimethanol(meth)acrylate and isobornyl(meth)acrylate.

Examples of (meth)acrylate compounds having two (meth) acryloyl groups within the molecule include ethylene glycol di(meth)acrylate, diethylene glycol di(meth)acrylate, triethylene glycol di(meth)acrylate, tetraethylene glycol di(meth) acrylate, 2-(meth)acryloyloxyethyl acid phosphate, 1,4-butanediol di(meth)acrylate, 1,6-hexanediol di(meth)acrylate, 1,9-nonanediol di(meth)acrylate, glycerol di(meth)acrylate, neopentyl glycol di(meth)acrylate, 3-methyl-1,5-pentanediol di(meth)acrylate, 2-butyl-2-ethyl-1,3-propane di(meth)acrylate, dimthyloltricyclodecane di(meth)acrylate, propylene glycol ethtacrylate dipropylene glycol di(meth)acrylate, tripropylene glycol di(meth)acrylate, tetrapropylene glycol di(meth)acrylate, neopentyl glycol hydroxypivalate di(meth) acrylate, 1,3-butanediol di(meth)acrylate, dimethyloldicyclopentane di(meth)acrylate, and dimethylolpropane di(meth)acrylate.

Among these, diethylene glycol di(meth)acrylate, 1,6-hexanediol di(meth)acrylate, dimethyloltricyclodecane di(meth) acrylate, dipropylene glycol di(meth)acrylate, dimethyloldicyclopentane di(meth)acrylate and dimethylolpropane di(meth)acrylate are preferred.

Examples of (meth)acrylate compounds having three or more (meth)acryloyl groups within the molecule include tris (2-hydroxyethyl)isocyanurate tri(meth)acrylate, trimethylolpropane tri(meth)acrylate, pentaerythritol tri(meth)acrylate, propoxylated trimethylolpropane tri(meth)acrylate, ethoxylated trimethylolpropane tri(meth)acrylate, dimethylolpropane tetra(meth)acrylate, pentaerythritol tetra(meth)acrylate, propoxylated pentaerythritol tetra(meth)acrylate, ethoxylated pentaerythritol tetra(meth)acrylate, dipentaerythritol hexa(meth)acrylate, and tris(acryloyloxyethyl)isocyanurate.

Among these, trimethylolpropane tri(meth)acrylate and dipentaerythritol hexa(meth)acrylate are preferred.

The amount of the active energy beam-curable compound, based on an amount of 100% by mass for the entire coating film-forming component, is preferably within a range from 10 to 70% by mass, and more preferably from 25 to 70% by mass.

(Average Molecular Weight Between Crosslinks)

The coating film-forming component has an average molecular weight between crosslinks of 180 to 1,000. Provided the average molecular weight between crosslinks is at least 180, the shrinkage stress of the base coat layer formed using the coating composition of the present invention does not become too powerful, enabling the adhesion between the metal substrate and the metal thin film to be favorably maintained. Further, cracking of the metal thin film can be suppressed, even when a top coat layer is provided on the metal thin film formed on the base coat layer, or even when heating is performed during a heat resistance test. On the other hand, provided the average molecular weight between crosslinks is not more than 1,000, a satisfactorily crosslinked base coat layer can be more readily formed. As a result, the heat resistance of the base coat layer can be ensured, and cracking of the metal thin film can be suppressed, even when a top coat layer is provided on the metal thin film formed on the base coat layer, or even when heating is performed during a heat resistance test.

The average molecular weight between crosslinks of the coating film-forming component is preferably within a range from 300 to 900, and more preferably from 500 to 800.

In the present invention, the average molecular weight between crosslinks describes the average value of the molecular weight between crosslinks, which is calculated by dividing the average molecular weight of the monomers used in forming the coating film-forming component by the average number of reactive functional groups within those monomers (in other words, the combined total of the molecular weight between crosslinks for each monomer calculated in accordance with the proportion of the monomer). For example, in the case where the coating film-forming component contains 50% by mass of a monomer having an average molecular weight $W_1$ and a number of reactive functional groups $N_1$, and 50% by mass of a monomer having an average molecular weight $W_2$ and a number of reactive functional groups $N_2$, the average molecular weight between crosslinks for the coating film-forming component is $(W_1/N_1) \times 0.5 + (W_2/N_2) \times 0.5$.

The average molecular weight of a monomer may be either the weight-average molecular weight measured by gel permeation chromatography (GPC) and reported as a polystyrene-equivalent value, or the theoretical molecular weight calculated from the structural formula.

<Other Components>

The coating composition typically contains a photopolymerization initiator in addition to the coating film-forming component described above.

Examples of the photopolymerization initiator include products such as Irgacure 184, Irgacure 149, Irgacure 651, Irgacure 907, Irgacure 754, Irgacure 819, Irgacure 500, Irgacure 1000, Irgacure 1800 and Irgacure 754, manufactured by Ciba Specialty Chemicals Inc.; Lucirin TPO, manufactured by BASF Corporation; and Kayacure DETX-S, Kayacure EPA and Kayacure DMBI, manufactured by Nippon Kayaku Co., Ltd. These photopolymerization initiators may be used individually, or two or more may be used in combination.

Further, a photosensitizer or photoaccelerator may be used in combination with the photopolymerization initiator.

The amount of the photopolymerization initiator is preferably within a range from 0.3 to 10.0 parts by mass, and more preferably from 0.5 to 8.0 parts by mass, per 100 parts by mass of the coating film-forming component. Provided the amount of the photopolymerization initiator satisfies the above range, a satisfactory degree of crosslinking is obtained.

Furthermore, if required, the coating composition may also contain a thermoplastic resin and any of various solvents.

Examples of the thermoplastic resin include (meth)acrylic acid-based resins, including homopolymers such as poly(methyl methacrylate), poly(ethyl methacrylate), poly(butyl methacrylate) and poly(2-ethylhexyl methacrylate), and copolymers thereof. Among these, poly(methyl methacrylate) is preferred.

The thermoplastic resin may be added to the prepared coating composition in accordance with the intended use of the composition, and the amount of the thermoplastic resin is preferably within a range from 0 to 40 parts by mass, and more preferably from 0 to 20 parts by mass, per 100 parts by mass of the coating film-forming component. The effects of the present invention are still satisfactorily realized even in those cases where the coating composition does not contain a thermoplastic resin, but if a thermoplastic resin is included in an amount within the above range, then various physical properties of the formed base coat layer are improved, including the adhesion, suppression of cracking of the metal thin film is maintained, and the fluidity of the coating composition is improved.

Examples of the solvents include hydrocarbon-based solvent such as toluene, xylene, solvent naphtha, methylcyclohexane and ethylcyclohexane; ester-based solvents such as ethyl acetate, butyl acetate and ethylene glycol monomethyl ether acetate; and ketone-based solvents such as acetone, methyl ethyl ketone, methyl isobutyl ketone and diisobutyl ketone. These solvents may be used individually, or two or more solvents may be used in combination.

Furthermore, the coating composition may also contain appropriate amounts of the types of additives typically used in coating materials, including ultraviolet absorbers, antioxidants, radical scavengers, surface modifiers, plasticizers and pigment anti-settling agents, as well as appropriate amounts of delustering agents, dyes and pigments.

The coating composition can be prepared by mixing the coating film-forming component containing the aforementioned epoxy (meth)acrylate having a cyclic structure and, where necessary, the active energy beam-curable compound, with the other components such as the photopolymerization initiator, the thermoplastic resin, the solvent and any of the various additives.

The proportion of the coating film-forming component within the coating composition may be set as required, but is preferably within a range from 40 to 98% by mass, and more preferably from 50 to 95% by mass, based on a value of 100% by mass for the entire coating composition.

Because the coating composition of the present invention described above contains at least 30% by mass of the epoxy (meth)acrylate having a cyclic structure, and has an average molecular weight between crosslinks of 180 to 1,000, a base coat layer can be formed that exhibits excellent heat resistance, and is resistant to expansion even when heated. As a result, even when a top coat layer is provided on the metal thin film formed on the base coat layer, or even when heating is performed during a heat resistance test, because the base coat layer is resistant to expansion, there is no necessity for the metal thin film to conform to changes in the base coat layer, meaning cracking of the metal thin film can be suppressed.

Accordingly, by using the coating composition of the present invention, cracking of the metal thin film can be suppressed even under heating, and therefore coating materials capable of forming tough films can be used as the coating material for the top coat layer, including heat-curable coating materials that require application of a high temperature for curing, and ultraviolet-curable coating materials which require only a short time for film formation, but produce a momentary rapid increase in the temperature of the substrate surface as a result of the ultraviolet irradiation performed during curing, thus enabling satisfactory protection of the metal thin film.

[Composite Film]

The composite film of the present invention contains a base coat layer formed by applying the coating composition of the present invention to a metal substrate, a metal thin film formed on the base coat layer, and a top coat layer formed on the metal thin film.

Examples of the metal substrate include aluminum wheels, steel wheels, magnesium wheels and aluminum sashes for vehicles.

Further, examples of the material of the metal substrate include aluminum, iron, brass, copper and tin.

Moreover, a chemical conversion coating may be formed on the surface of the metal substrate on which the base coat layer is to be formed. Forming a chemical conversion coating activates the surface of the metal substrate and improves the adhesion with the base coat layer.

The base coat layer is formed from the coating composition of the present invention. The thickness of the base coat layer is preferably within a range from 3 to 100 µm, and more preferably from 5 to 50 µm.

Examples of the material of the metal thin film include aluminum, iron, nickel, chrome, titanium, copper, silver, zinc, tin, indium, magnesium, zirconium, oxides and nitrides of these metals, and alloys of these metals. Among these, the coating composition of the present invention is particularly suited to those cases where a metal thin film formed from chrome or a chrome alloy is provided on the metal substrate.

The thickness of the metal thin film is preferably within a range from 10 to 70 nm, and more preferably from 20 to 50 nm. Provided the thickness of the metal thin film is at least 10 nm, satisfactory design properties can be imparted to the product. On the other hand, provided the thickness of the metal thin film is not more than 70 nm, cracking of the metal thin film can be suppressed effectively, even when a top coat is provided, or even when heating is performed during a heat resistance test.

The top coat layer protects the metal thin film, and is formed by applying a top coat layer coating material. The top coat layer coating material can employ the types of coating materials typically used for forming top coat layers, and examples include room temperature-drying one-pot coating materials such as acrylic lacquer coating materials; heat-curable top clear coating materials such as acrylic melamine curable clear coating materials, aluminum chelate curable acrylic coating materials, and acrylic urethane curable coating materials; and active energy beam-curable top clear coating materials.

The thickness of the top coat layer is preferably within a range from 3 to 100 µm, and more preferably from 5 to 50 µm.

During formation of the composite film of the present invention, a powder coating may be formed between the metal substrate and the base coat layer. By forming a powder coating, the adhesion between the metal substrate and the base coat layer can be improved by the powder coating.

The powder coating is formed by powder coating a powder coating material onto the metal substrate.

The powder coating material is a powdered (solid) coating material containing no solvents such as organic solvents or water, and having a solid fraction of 100% by mass. Besides resins, the powder coating material may also include pigments, curing agents, additives and fillers and the like. Conventional powder coating materials typically used for powder coating can be used as the powder coating material.

Furthermore, the composite film of the present invention may have an intermediate layer formed between the metal thin film and the top coat layer.

Examples of materials that may be used for forming the intermediate layer include room temperature-drying one-pot coating materials such as acrylic lacquer coating materials, and heat-curable coating materials such as acrylic urethane curable coating materials and acrylic melamine curable coating materials.

<Method for Producing Composite Film>

One example of the method for producing the composite film of the present invention is described below in further detail.

The method for producing a composite film according to the present invention includes a step of forming a base coat layer on a metal substrate, a step of forming a metal thin film on the base coat layer, and a step of forming a top coat layer on the metal thin film.

In the step of forming the base coat layer, the coating composition of the present invention is first applied to the metal substrate in an amount that is sufficient to produce a thickness following curing that satisfies the range described above. Examples of the method used for applying the composition include spray coating methods, brush coating methods, roller coating methods, curtain coating methods, flow coating methods, and dip coating methods.

Subsequently, the composition is irradiated with ultraviolet radiation having an intensity of not more than 5,000 $mJ/cm^2$, and typically 100 to 3,000 $mJ/cm^2$ (intensity value measured using a UVR-N1 device manufactured by Nippon Denchi Co., Ltd.) using a fusion lamp, high-pressure mercury lamp or metal halide lamp or the like, thus forming the base coat layer.

Besides ultraviolet radiation, an electron beam or gamma rays or the like may also be used as the active energy beam.

Prior to formation of the base coat layer on the metal substrate, the surface of the metal substrate on which the base coat layer is to be formed is preferably subjected to a chemical conversion treatment and/or a powder coating treatment. By performing these treatments, the adhesion between the metal substrate and base coat layer can be further improved. The adhesion between the metal substrate and the base coat layer can be improved particularly favorably by performing both a chemical conversion treatment and a powder coating treatment.

When the surface of the metal substrate is subjected to a chemical conversion treatment, a treatment agent such as triethanolamine or sodium hydroxide acts upon the surface of the metal substrate, thereby removing any foreign matter or oxide films adhered to the surface of the metal substrate, and forming a chemical conversion coating. Forming this chemical conversion coating activates the surface of the metal substrate.

On the other hand, when the surface of the metal substrate is subjected to a powder coating treatment, a powder coating material described above is first coated onto the metal substrate using an electrostatic powder coating method (spray coating) or a fluidized bed coating method (dip coating). Subsequently, heating is performed to bake and cure the powder coating material, thus forming a powder coating on the surface of the metal substrate.

When both a chemical conversion treatment and a powder coating treatment are performed, the powder coating treatment is performed after the chemical conversion treatment. A shot blast treatment may be performed prior to the chemical conversion treatment to activate the surface of the metal substrate.

In the step of forming the metal thin film, the metal thin film is formed on the base coat layer by sputtering, which is performed so as to form a film thickness that satisfies the range described above.

The sputtering conditions are set as follows.

The inert gas pressure is typically within a range from 0.05 to 1.00 Pa, and preferably from 0.20 to 0.80 Pa. Provided the inert gas pressure is at least 0.05 Pa, the discharge during sputtering is satisfactory, and a metal thin film of the desired thickness can be formed in a relatively short period of time. On the other hand, provided the inert gas pressure is not more than 1.00 Pa, discoloration of the metal thin film can be prevented.

The deposition rate is typically within a range from 1 to 10 nm/second, and preferably from 2 to 8 nm/second. Provided the deposition rate is at least 1 nm/second, a favorable level of production efficiency can be maintained. On the other hand, provided the deposition rate is not more than 10 nm/second, the sputtering apparatus can be reduced in size.

The target power is typically within a range from 1.0 to 10.0 $W/cm^2$, and preferably from 3 to 9 $W/cm^2$. Provided the target power is at least 1.0 $W/cm^2$, the metal thin film can be formed in a short period of time. On the other hand, provided the target power is not more than 10.0 $W/cm^2$, the internal stress within the metal thin film can be prevented from becoming too high, and cracking of the metal thin film can be effectively suppressed, even when a top coat layer is provided, or even when heating is performed during a heat resistance test.

The inert gas pressure conditions, the deposition rate conditions and the target power conditions can be combined appropriately within the respective numerical ranges described above.

In the step of forming the top coat layer, the top coat layer coating material described above is first applied to the metal thin film. Examples of the method used for applying the top coat layer coating material include the same coating methods as those mentioned above for applying the coating composition when forming the base coat layer.

Subsequently, if the top coat layer coating material is a heat-curable coating material, then the coating material is heated and dried at 40 to 180° C. to form the top coat layer. If the top coat layer coating material is an active energy beam-curable coating material, then the coating material is irradiated with an active energy beam to form the top coat layer. The irradiation conditions for the active energy beam may be the same as the active energy beam irradiation conditions described above for formation of the base coat layer.

The composite film of the present invention obtained in this manner includes a base coat layer formed using the coating composition of the present invention. Accordingly, even when a top coat layer is provided on the metal thin film formed on the base coat layer, or even when the composite film is subjected to heating during a heat resistance test, because the base coat layer is resistant to expansion, cracking of the metal thin film can be suppressed. Metal thin films formed from chrome or a chrome alloy exhibit excellent hardness and are therefore particularly prone to cracking, but if the coating composition of the present invention is used, then even when a metal thin film of chrome or a chrome alloy is formed on a metal substrate, cracking of the metal thin film can still be suppressed. Furthermore, cracking of the metal thin film can be suppressed even under heating, and therefore the aforementioned types of coating materials capable of forming tough films can be used as the coating material for the top coat layer, enabling good protection of the metal thin film.

Furthermore, in the composite film of the present invention, even if the substrate surface is subjected to a powder coating treatment prior to formation of the base coat layer, the formed powder coating is fixed by the base coat layer, and therefore does not expand even upon heating, meaning the metal thin film is unlikely to crack.

Further, in the composite film of the present invention, the adhesion is favorable between the metal substrate and the base coat layer, between the base coat layer and the metal thin film, and between the metal thin film and the top coat layer. If the surface of the metal substrate is subjected to a chemical conversion treatment and/or a powder coating treatment prior to the formation of the base coat layer, then the adhesion between the metal substrate and the base coat layer can be improved considerably.

There are no particular limitations on the potential uses of the composite film of the present invention, and examples are numerous, including vehicle components such as aluminum wheels, household electrical appliances, spectacles, gaming devices, furniture and lighting equipment.

EXAMPLES

The present invention is described below in further detail using a series of examples, but the present invention is in no way limited by these examples.

The components used in each of the examples are described below.

<Coating Film-Forming Component>

(Epoxy (meth)acrylates having a cyclic structure)

A-1: phenol novolac epoxy acrylate

The phenol novolac epoxy acrylate was prepared in the manner described below.

100 g of a phenol novolac epoxy resin (EPPN-201L manufactured by Nippon Kayaku Co., Ltd., epoxy equivalent weight: 180 to 200 g/eq) was dissolved in 50 mL of propylene glycol monomethyl ether acetate, 39.8 g of acrylic acid, 0.2 g of benzyltriethylammonium chloride and 50 mg of hydroquinone were added, and the resulting mixture was reacted at 120° C. under a stream of air for 6 hours, yielding a phenol novolac epoxy acrylate (acid value: 2.6 mg-KOH/g). The acid value was measured by performing titration with a solution prepared by dissolving potassium hydroxide in methanol to prepare a solution of 0.1 N.

A-2: cresol novolac epoxy acrylate

The cresol novolac epoxy acrylate was prepared in the manner described below.

100 g of a cresol novolac epoxy resin (EOCN-104S manufactured by Nippon Kayaku Co., Ltd., epoxy equivalent weight: 210 to 230 g/eq) was dissolved in 50 mL of propylene glycol monomethyl ether acetate, 34.3 g of acrylic acid, 0.2 g of benzyltriethylammonium chloride and 50 mg of hydroquinone were added, and the resulting mixture was reacted at 120° C. under a stream of air for 6 hours, yielding a cresol novolac epoxy acrylate (acid value: 2.1 mg-KOH/g).

Besides the compounds listed described above, the following compounds were also used as epoxy (meth)acrylates having a cyclic structure.

A-3: phenol-based epoxy acrylate (DA-141, manufactured by Nagase ChemteX Corporation)

A-4: phenol-based epoxy acrylate (DA-721, manufactured by Nagase ChemteX Corporation)

A-5: hydrogenated phenol-based epoxy acrylate (DA-722, manufactured by Nagase ChemteX Corporation)

A-6: bisphenol A epoxy acrylate (DA-250, manufactured by Nagase ChemteX Corporation)

(Active Energy Beam-Curable Compounds)

The compounds listed below were used as active energy beam-curable compounds.

B-1: difunctional alicyclic monomer (dimethylolpropane diacrylate, Kayarad R-684, manufactured by Nippon Kayaku Co., Ltd.)

B-2: hexafunctional monomer (dipentaerythritol hexaacrylate (DPHA), Kayarad DPHA, manufactured by Nippon Kayaku Co., Ltd.)

B-3: trifunctional monomer (trimethylolpropane triacrylate (TMPTA), Aronix M-309, manufactured by Toagosei Co., Ltd.)

B-4: difunctional monomer (hexanediol diacrylate, Laromer HDDA, manufactured by BASF Corporation)

B-5: urethane oligomer (UV-3200B, manufactured by The Nippon Synthetic Chemical Industry Co., Ltd.)

B-6: monofunctional alicyclic monomer (isobornyl acrylate, Ebecryl IBOA, manufactured by Daicel-Cytec Co., Ltd.)

<Other Components>

The compounds listed below were used as other components.

Thermoplastic resin: acrylic resin (Acrylic Base LH101, manufactured by Fujikura Kasei Co., Ltd.)

Photopolymerization initiator: (Irgacure 184, manufactured by Ciba Specialty Chemicals Inc.)

Solvent: butyl acetate

The physical properties of the epoxy (meth)acrylates having a cyclic structure and the active energy beam-curable compounds contained within the coating film-forming component are shown in Table 1.

For the average molecular weights of each of the compounds, the weight-average molecular weight was used for the compounds A-1, A-2 and B-5, whereas the theoretical molecular weight was used for the compounds A-3 to A-6, B-1 to B-4, and B-6.

The weight-average molecular weight was measured by gel permeation chromatography under the conditions listed below, and represents the polystyrene-equivalent weight-average molecular weight.

Apparatus: GPC-101, manufactured by Shoko Co., Ltd.

Column: two TSK-Gel GMH columns, manufactured by Tosoh Corporation, and one TSK-Gel G2000H column manufactured by Tosoh Corporation Mobile phase: tetrahydrofuran (THF)

Flow rate: 1.0 mL/minute

On the other hand, the theoretical molecular weight was calculated from the structural formula.

TABLE 1

| | | Average molecular weight | Number of reactive functional groups | Molecular weight between crosslinks |
|---|---|---|---|---|
| Epoxy (meth)acrylate having a cyclic structure | A-1 | 1,644 | 6 | 274 |
| | A-2 | 2,400 | 6.8 | 353 |
| | A-3 | 222 | 1 | 222 |
| | A-4 | 422 | 2 | 211 |
| | A-5 | 428 | 2 | 214 |
| | A-6 | 568 | 2 | 284 |

TABLE 1-continued

|  |  | Average molecular weight | Number of reactive functional groups | Molecular weight between crosslinks |
|---|---|---|---|---|
| Active energy beam-curable compound | B-1 | 304 | 2 | 152 |
|  | B-2 | 578 | 6 | 96 |
|  | B-3 | 296 | 3 | 99 |
|  | B-4 | 226 | 2 | 113 |
|  | B-5 | 10,000 | 2 | 5,000 |
|  | B-6 | 208 | 1 | 208 |

[Preparation of Base Coat Coating Compositions]

The various components were mixed in the solid fraction ratios (mass ratios) shown in Table 2 to prepare base coat coating compositions X-1 to X-15. In Table 2, the "epoxy (meth)acrylate proportion" refers to the proportion of the epoxy (meth)acrylate having a cyclic structure, based on a value of 100% by mass for the entire coating film-forming component.

TABLE 2

| Base coat coating composition |  |  | X-1 | X-2 | X-3 | X-4 | X-5 | X-6 | X-7 | X-8 | X-9 | X-10 | X-11 | X-12 | X-13 | X-14 | X-15 |
|---|---|---|---|---|---|---|---|---|---|---|---|---|---|---|---|---|---|
| Coating film-forming component | Epoxy (meth)acrylate (parts by mass) | A-1 | — | 25 | 50 | — | 75 | — | — | — | 50 | 60 | — | 20 | — | — | 15 |
|  |  | A-2 | 100 | 25 | — | 30 | — | 75 | 15 | 25 | — | — | — | — | 10 | 65 | — |
|  |  | A-3 | — | — | — | — | — | — | 10 | — | — | 10 | — | — | — | — | — |
|  |  | A-4 | — | — | — | — | 15 | — | 20 | — | — | — | — | 40 | — | — |
|  |  | A-5 | — | — | — | — | — | — | — | 25 | — | — | — | — | — | — | — |
|  |  | A-6 | — | — | — | — | — | — | 5 | 20 | — | — | 100 | — | — | — | — |
|  | Active energy beam-curable compound (parts by mass) | B-1 | — | — | — | — | — | — | — | — | — | — | — | — | — | — | 40 |
|  |  | B-2 | — | — | 15 | 30 | — | 10 | 30 | 30 | 34 | 30 | — | 40 | 50 | 18 | 20 |
|  |  | B-3 | — | 50 | — | 25 | — | — | 20 | — | — | — | — | 25 | — | — | 15 |
|  |  | B-4 | — | — | — | 10 | 10 | — | — | — | — | — | — | — | — | — | — |
|  |  | B-5 | — | — | 10 | 5 | — | 5 | — | — | 16 | — | — | 5 | — | 17 | 10 |
|  |  | B-6 | — | — | 25 | — | — | 10 | — | — | — | — | — | 10 | — | — | — |
| Other components | Thermoplastic resin (parts by mas) |  | — | — | — | — | — | — | — | — | — | 20 | — | — | — | — | — |
|  | Photopolymerization initiator (parts by mass) |  | 8 | 8 | 8 | 8 | 8 | 8 | 8 | 8 | 8 | 8 | 8 | 8 | 8 | 8 | 8 |
|  | Solvent (parts by mass) |  | 100 | 100 | 100 | 100 | 100 | 100 | 100 | 100 | 100 | 100 | 100 | 100 | 100 | 100 | 100 |
| Proportion of epoxy (meth)acrylate (% by mass) |  |  | 100 | 50 | 50 | 30 | 90 | 75 | 50 | 70 | 50 | 70 | 100 | 20 | 50 | 65 | 15 |
| Average molecular weight between crosslinks for coating film-forming component |  |  | 353 | 206 | 703 | 421 | 248 | 545 | 180 | 227 | 970 | 216 | 284 | 389 | 168 | 1097 | 636 |

Example 1

The surface of an aluminum wheel casting for a vehicle was subjected to a shot blast treatment, and the casting was then subjected to a chemical conversion treatment (hydration-oxidation treatment) by dipping in an aqueous solution of triethanolamine with a concentration of 100 g/L at 90° C. for 1 minute, thereby forming a chemical conversion coating on the surface of the casting. Subsequently, an acrylic undercoat powder coating material (Everclad No. 5600, manufactured by Kansai Paint Co., Ltd.) was applied by electrostatic powder coating in an amount sufficient to form a dried thickness of 110 μm, and the coating material was then subjected to a single bake treatment at 160° C. for 20 minutes to form a powder coating.

Next, the base coat coating composition X-1 was spray-coated onto the casting using a spray gun, in an amount sufficient to form a cured thickness of 30 μm, and following drying and removal of the solvent by heating in a hot air dryer at 80° C. for 10 minutes, the coating composition was irradiated with ultraviolet light using a high-pressure mercury lamp at an intensity of 300 mJ/cm$^2$ (measured by a UVR-N1 device, manufactured by Nippon Denchi Co., Ltd.), thereby forming a base coat layer on the powder coating.

Subsequently, the casting was set in a sputtering apparatus (CFS-8ES, manufactured by Tokuda Seisakusho Co., Ltd.), and using chrome as the metal material, sputtering was performed under the conditions shown in Table 3, forming a metal thin film (chrome thin film) on the base coat layer.

A top coat layer coating material (ET5406, manufactured by Fujikura Kasei Co., Ltd.) was then spray-coated onto the chrome thin film using a spray gun, in an amount sufficient to form a cured thickness of 12 μm, and the coating material was dried in a hot air dryer at 120° C. for 15 minutes, thus forming a top coat layer on the chrome thin film and completing preparation of the test piece.

<Evaluations>

Test pieces obtained in the manner described above were evaluated for initial adhesion, initial external appearance, adhesion following hot-water immersion, adhesion following heating, and external appearance following heating under the various conditions described below. The results are shown in Table 3.

(Evaluation of Initial Adhesion)

A cutter was used to cut a 10×10 square grid into the surface of the test piece with a width of 1 mm between cuts, and an operation was then performed in which a tape was bonded to the grid portion and then peeled away, with the adhesion being evaluated against the following evaluation criteria. The tape used was a cellophane tape (manufactured by Nichiban Co., Ltd.).

A: no peeling was observed.

B: the corner portions of some squares lifted, but not a practical concern.

C: peeling of at least one square was observed.

(Evaluation of Initial External Appearance)

The state of the chrome thin film was inspected visually, and the external appearance of the test piece was evaluated against the following evaluation criteria.

A: no problems were observed with the state of the chrome thin film, which had a darkish texture, no discoloration, and no cracking.

B: the chrome thin film exhibited minor problems of texture, discoloration or cracking, but not a practical concern.

C: the chrome thin film exhibited problems of texture, discoloration or cracking.

(Evaluation of Adhesion Following Hot-Water Immersion)

The test piece was immersed in hot water at 40° C. for 240 hours, a cutter was then used to cut a 10×10 square grid into the surface of the test piece with a width of 1 mm between cuts, and an operation was performed in which a tape was bonded to the grid portion and then peeled away, with the adhesion being evaluated against the following evaluation criteria. The tape used was a cellophane tape (manufactured by Nichiban Co., Ltd.).

A: no peeling was observed.

B: the corner portions of some squares lifted, but not a practical concern.

C: peeling of at least one square was observed.

(Evaluation of Adhesion Following Heating)

The test piece was left to stand for 240 hours in an atmosphere at 110° C., a cutter was then used to cut a 10×10 square grid into the surface of the test piece with a width of 1 mm between cuts, and an operation was performed in which a tape was bonded to the grid portion and then peeled away, with the adhesion being evaluated against the following evaluation criteria. The tape used was a cellophane tape (manufactured by Nichiban Co., Ltd.).

A: no peeling was observed.

B: the corner portions of some squares lifted, but not a practical concern.

C: peeling of at least one square was observed.

(Evaluation of External Appearance Following Heating)

The test piece was left to stand for 240 hours in an atmosphere at 110° C., the state of the chrome thin film was then inspected visually, and the external appearance of the test piece was evaluated against the following evaluation criteria.

A: no problems were observed with the state of the chrome thin film, which had a darkish texture, no discoloration, and no cracking.

B: the chrome thin film exhibited minor problems of texture, discoloration or cracking, but not a practical concern.

C: the chrome thin film exhibited problems of texture, discoloration or cracking.

Examples 2 to 20, Comparative Examples 1 to 4

With the exceptions of using the base coat coating compositions shown in Tables 3 and 4, and altering the sputtering conditions to those shown in Tables 3 and 4, test pieces were prepared and evaluated in the same manner as the example 1. The results are shown in Tables 3 and 4.

TABLE 3

| | | Example | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Base coat coating composition | | X-1 | X-1 | X-1 | X-2 | X-2 | X-2 | X-3 | X-3 | X-4 | X-5 | X-6 | X-7 |
| Sputtering conditions | Inert gas pressure (Pa) | 0.03 | 0.2 | 0.8 | 0.07 | 0.5 | 1.5 | 1.0 | 0.5 | 0.5 | 0.5 | 0.5 | 0.5 |
| | Deposition rate (nm/second) | 1 | 1 | 10 | 1 | 7 | 6 | 7 | 7 | 7 | 7 | 7 | 7 |
| | Target power (W/cm$^2$) | 5 | 1 | 10 | 5 | 5 | 5 | 5 | 7 | 7 | 5 | 5 | 5 |
| | Thickness of chrome thin film (nm) | 10 | 20 | 50 | 20 | 40 | 20 | 70 | 30 | 40 | 40 | 40 | 40 |
| Evaluations | Initial adhesion | A | A | A | A | A | A | A | A | A | A | A | B[1] |
| | Initial external appearance | B[2] | A | A | A | A | B[3] | A | A | A | A | A | B[4] |
| | Adhesion following hot-water immersion | A | A | A | A | A | A | A | A | A | A | A | B[1] |
| | Adhesion following heating | A | A | A | A | A | A | A | A | A | A | A | B[1] |
| | External appearance following heating | B[2] | A | A | A | A | B[3] | A | A | A | A | A | B[4] |

TABLE 4

| | | Example | | | | | | | | Comparative example | | | |
|---|---|---|---|---|---|---|---|---|---|---|---|---|---|
| | | 13 | 14 | 15 | 16 | 17 | 18 | 19 | 20 | 1 | 2 | 3 | 4 |
| Base coat coating composition | | X-8 | X-9 | X-9 | X-9 | X-10 | X-10 | X-10 | X-11 | X-12 | X-13 | X-14 | X-15 |
| Sputtering conditions | Inert gas pressure (Pa) | 0.5 | 0.5 | 0.5 | 0.8 | 0.5 | 0.5 | 0.8 | 0.8 | 0.5 | 0.8 | 0.5 | 0.8 |
| | Deposition rate (nm/second) | 7 | 6 | 7 | 10 | 6 | 7 | 10 | 10 | 7 | 10 | 7 | 10 |
| | Target power (W/cm$^2$) | 5 | 8 | 5 | 7.5 | 8 | 5 | 7.5 | 10 | 5 | 7.5 | 5 | 7.5 |
| | Thickness of chrome thin film (nm) | 40 | 5 | 40 | 30 | 80 | 40 | 30 | 50 | 40 | 30 | 40 | 30 |
| Evaluations | Initial adhesion | A | A | A | A | A | A | A | A | A | C[1] | A | A |
| | Initial external appearance | B[4] | B[2] | B[4] | B[4] | B[4] | A | A | B[4] | B[4] | C[4] | C[4] | C[4] |
| | Adhesion following hot-water immersion | A | A | A | A | A | A | A | A | A | C[1] | A | A |

TABLE 4-continued

| | Example | | | | | | | | Comparative example | | | |
|---|---|---|---|---|---|---|---|---|---|---|---|---|
| | 13 | 14 | 15 | 16 | 17 | 18 | 19 | 20 | 1 | 2 | 3 | 4 |
| Adhesion following heating | A | A | A | A | A | A | A | A | A | C[1] | A | A |
| External appearance following heating | B[4] | B[2] | B[4] | B[4] | B[4] | A | A | B[4] | C[4] | C[4] | C[4] | C[4] |

In Tables 3 and 4, in the evaluations for the initial external appearance and the external appearance following heating, the evaluations B[2] and C[2] mean that the texture of the test piece had deteriorated, the evaluations B[3] and C[3] mean that the chrome thin film had undergone discoloration, and the evaluations B[4] and C[4] mean that the chrome thin film had developed cracking. In each of these cases, the B evaluation indicates that the problem was of a level that was not a practical concern.

As is evident from Tables 3 and 4, the test pieces obtained in each of the examples exhibited excellent adhesion. Further, the state of the chrome thin film was generally good.

In the case of the example 1, where the sputtering was performed at an inert gas pressure of 0.03 Pa, and so that the thickness of the chrome thin film was 10 nm, the texture of the test piece deteriorated slightly.

In the case of the example 6, where the sputtering was performed at an inert gas pressure of 1.5 Pa, the formed chrome thin film exhibited slight discoloration.

In the case of the example 12, which used the base coat coating composition X-7 containing a coating film-forming component in which the proportion of A-2 was 15% by mass and the average molecular weight between crosslinks was 180, the adhesion deteriorated slightly. Further, when the chrome thin film was exposed to heat, slight cracking occurred.

In the case of the example 13, which used the base coat coating composition X-8 containing a coating film-forming component in which the proportion of A-2 was 25% by mass, slight cracking occurred in the chrome thin film upon exposure to heat.

In the case of the examples 14 to 16, which used the base coat coating composition X-9 containing a coating film-forming component in which the average molecular weight between crosslinks was 970, the texture of the test piece deteriorated slightly in the example 14 where sputtering was performed so that the thickness of the chrome thin film was 5 nm. In contrast, in the examples 15 and 16, because the thickness of the chrome thin film was satisfactory, the texture of the test pieces was favorable, but slight cracking occurred in the chrome thin film upon exposure to heat.

In the case of the example 17, where sputtering was performed so that the thickness of the chrome thin film was 80 nm, slight cracking occurred in the chrome thin film upon exposure to heat.

In the case of the example 20, which used the base coat coating composition X-11 containing a coating film-forming component in which the proportion of A-6 was 100% by mass, slight cracking occurred in the chrome thin film upon exposure to heat.

In contrast, in the case of the comparative example 1, which used the base coat coating composition X-12 containing a coating film-forming component in which the proportion of the epoxy (meth)acrylate having a cyclic structure was 20% by mass, cracking occurred in the chrome thin film upon exposure to heat.

In the case of the comparative example 2, which used the base coat coating composition X-13 containing a coating film-forming component with an average molecular weight between crosslinks of 168, the adhesion deteriorated. Further, cracking occurred in the chrome thin film upon exposure to heat.

In the case of the comparative example 3, which used the base coat coating composition X-14 containing a coating film-forming component with an average molecular weight between crosslinks of 1,097, cracking occurred in the chrome thin film upon exposure to heat.

In the case of the comparative example 4, which used the base coat coating composition X-15 containing a coating film-forming component in which the proportion of the epoxy (meth)acrylate having a cyclic structure was 15% by mass, cracking occurred in the chrome thin film upon exposure to heat.

The invention claimed is:

1. A base coat coating composition used for undercoating a metal thin film formed on a metal substrate, wherein
    the base coat coating composition consists of a coating film-forming component which consists of an epoxy (meth)acrylate having a cyclic structure and an active energy beam-curable compound, a photopolymerization initiator, and a solvent,
    the amount of the epoxy(meth)acrylate having a cyclic structure in the coating film-forming component is 30 to 90% by mass based on a total mass of the coating film forming component,
    the film-forming component has an average molecular weight between crosslinks of 180 to 1,000,
    the epoxy (meth)acrylate having a cyclic structure is at least one compound selected from the group consisting of phenol novolac epoxy (meth)acrylates and cresol novolac epoxy (meth)acrylates,
    the epoxy(meth)acrylate having a cyclic structure has an average number of reactive functional groups of 6 to 6.8, and
    the active energy beam-curable compound has an average number of reactive functional groups of 1 to 6.

2. The base coat coating composition according to claim 1, wherein the active energy beam-curable compound is at least one compound selected from the group consisting of urethane (meth)acrylate and (meth)acrylate compounds having at least one (meth)acryloyl group within the molecule.

3. The base coat coating composition according to claim 2 wherein (meth)acrylate compounds having at least one (meth)acryloyl group within the molecule is at least one compound selected from the group consisting of trimethylolpropane tri (meth)acrylate and dipentaerythritol hexa (meth) acrylate.

4. The base coat coating composition according to claim 1, wherein the average molecular weight between crosslinks is 300 to 900.

5. A composite film, comprising a base coat layer formed by applying the base coat coating composition according to claim 1 to a metal substrate, a metal thin film formed on the base coat layer and having a thickness of 10 to 70 nm, and a top coat layer formed on the metal thin film.

6. The composite film according to claim 5, wherein a metal of the metal thin film is chrome or a chrome alloy.

7. The composite film according to claim 5, wherein a powder coating is formed between the metal substrate and the base coat layer.

8. The composite film according to claim 5, wherein a chemical conversion coating is formed on a surface of the metal substrate on which the base coat layer is to be formed.

9. A method for producing a composite film, the method comprising: a step of applying the base coat coating composition according to claim 1 to a metal substrate to form a base coat layer, a step of forming a metal thin film having a thickness of 10 to 70 nm on the base coat layer by sputtering, and a step of forming a top coat layer on the metal thin film, wherein
conditions for the sputtering include an inert gas pressure of 0.05 to 1.00 Pa, a deposition rate of 1 to 10 nm/second, and a target power of 1.0 to 10.0 W/cm$^2$.

10. The method for producing a composite film according to claim 9, wherein the sputtering is performed using chrome or a chrome alloy.

11. The method for producing a composite film according to claim 9, wherein the base coat layer is formed on a surface of the metal substrate after subjecting the surface of the metal substrate to at least one of a chemical conversion treatment and a powder coating treatment.

* * * * *